United States Patent
Hane et al.

(10) Patent No.: US 9,388,496 B2
(45) Date of Patent: Jul. 12, 2016

(54) METHOD FOR DEPOSITING A FILM ON A SUBSTRATE, AND FILM DEPOSITION APPARATUS

(71) Applicant: Tokyo Electron Limited, Tokyo (JP)

(72) Inventors: Hideomi Hane, Iwate (JP); Takahito Umehara, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/602,403

(22) Filed: Jan. 22, 2015

(65) Prior Publication Data
US 2015/0214029 A1    Jul. 30, 2015

(30) Foreign Application Priority Data

Jan. 28, 2014 (JP) .................................. 2014-013739

(51) Int. Cl.
| | |
|---|---|
| *H01L 21/31* | (2006.01) |
| *C23C 16/458* | (2006.01) |
| *H01L 21/02* | (2006.01) |
| *C23C 16/448* | (2006.01) |
| *C23C 16/44* | (2006.01) |
| *C23C 16/455* | (2006.01) |
| *H01L 21/677* | (2006.01) |
| *H01L 21/687* | (2006.01) |

(52) U.S. Cl.
CPC ......... *C23C 16/4584* (2013.01); *C23C 16/4401* (2013.01); *C23C 16/448* (2013.01); *C23C 16/45519* (2013.01); *C23C 16/45551* (2013.01); *H01L 21/02164* (2013.01); *H01L 21/02271* (2013.01); *H01L 21/67748* (2013.01); *H01L 21/68764* (2013.01); *H01L 21/68771* (2013.01)

(58) Field of Classification Search
CPC ..... H01L 21/02; H01L 21/677; C23C 16/458; C23C 16/448; C23C 16/52
USPC ........................................... 438/782; 118/704
See application file for complete search history.

(56) References Cited

U.S. PATENT DOCUMENTS

| | | | | |
|---|---|---|---|---|
| 6,903,030 | B2 * | 6/2005 | Ishii | C23C 8/16 118/715 |
| 8,122,850 | B2 * | 2/2012 | Hishiya | H01L 21/02164 118/696 |
| 8,278,735 | B2 * | 10/2012 | Hashim | C23C 14/083 257/499 |
| 8,859,435 | B2 * | 10/2014 | Christenson | B08B 3/08 156/345.21 |
| 9,053,909 | B2 * | 6/2015 | Kato | C23C 16/452 |
| 9,129,797 | B2 * | 9/2015 | Tokoshima | H01L 21/0206 |
| 2008/0166884 | A1 * | 7/2008 | Nelson | C23C 16/45517 438/765 |
| 2009/0324369 | A1 * | 12/2009 | Scollay | H01L 21/67173 414/222.01 |
| 2010/0260935 | A1 * | 10/2010 | Kato | C23C 16/402 427/255.28 |
| 2013/0071990 | A1 * | 3/2013 | Hashim | C23C 16/405 438/396 |
| 2014/0206195 | A1 * | 7/2014 | Lauerhaas | H01L 21/6708 438/700 |

FOREIGN PATENT DOCUMENTS

JP        2008-283148        11/2008

* cited by examiner

*Primary Examiner* — Caleb Henry
(74) *Attorney, Agent, or Firm* — IPUSA, PLLC (57) ABSTRACT

A method for processing a substrate using a substrate processing apparatus is provided. The substrate processing apparatus includes a process chamber and a rotatable turntable having a substrate receiving part provided in the process chamber. In the method, a substrate is placed on a substrate receiving part, and the substrate is processed by supplying process gases into the process chamber. At least a water vapor is supplied into the chamber when the substrate is placed on the substrate receiving part. After that, the substrate is carried out of the process chamber.

7 Claims, 6 Drawing Sheets

METHOD FOR DEPOSITING A FILM ON A SUBSTRATE, AND FILM DEPOSITION APPARATUS

CROSS-REFERENCE TO RELATED APPLICAITONS

This patent application is based upon and claims the benefit of priority of Japanese Patent Application No. 2014-13739, filed on Jan. 28, 2014, the entire contents of which are incorporated herein by reference.

BACKGROUND OF THE INVENTION

1. Field of the Invention

The present invention relates to a method for processing a substrate and a substrate processing apparatus.

2. Description of the Related Art

In recent years, so-called turntable type film deposition apparatuses have been researched and developed as a film deposition apparatus that performs an ALD (Atomic Layer Deposition) method and the like. This film deposition apparatus includes a rotatable turntable on which a plurality of semiconductor wafers (which are hereinafter called "wafers") that are objects to be processed is placed in a vacuum chamber (i.e., process chamber). There is a supply area of a reaction gas A and a supply area of a reaction gas B, and separation areas separating the supply areas from each other. The areas are separately provided above the turntable.

When the above film deposition apparatus performs a substrate processing step repeatedly, a reaction product derived from the reaction gases cumulatively attaches to an inner wall of the process chamber, a substrate holding unit in the process chamber and the like, and a cumulative film (a deposited film) is formed. When a film thickness of the cumulative film exceeds a predetermined thickness, sometimes a gas generated from the cumulative film during a film deposition process reacts with another gas, by which a substance that is not expected to be generated may attach to the wafers. Moreover, if the cumulative film is cracked or peeled, particles may be generated, and the wafers may be contaminated.

To solve this, Japanese Laid-Open Patent Application Publication No. 2008-283148 discloses a method of removing a reaction product attached to an inner wall of a process chamber, a substrate holding unit and the like by supplying a cleaning gas into the process chamber after a film thickness of a cumulative film exceeds a predetermined thickness.

However, when the film thickness of the cumulative film is thick, particles may be generated from film flakes of the cumulative film attached to the inner wall of the process chamber. In particular, when an oxide-based film such as a silicon oxide film or the like is deposited on wafers, the particles are more likely to be generated than when a nitride-based film such as a silicon nitride film or the like is deposited on the wafers. Because of this, when depositing the oxide-based film, a cleaning treatment needs to be performed more frequently than when depositing the nitride-based film, by which a period of time allocable to the film deposition process is shortened. As a result, a PM (Preventive Maintenance) cycle that indicates a cycle of the preventive maintenance of a substrate processing apparatus becomes short, and a downtime of the substrate processing apparatus increases.

SUMMARY OF THE INVENTION

Embodiments of the present invention provide a method for processing a substrate and a substrate processing apparatus solving one or more of the problems discussed above.

More specifically, the embodiments of the present invention may provide a method for processing a substrate and a substrate processing apparatus that can reduce generation of particles.

According to one embodiment of the present invention, there is provided a method for processing a substrate using a substrate processing apparatus including a process chamber and a turntable having a substrate receiving part provided in the process chamber. In the method, a substrate is placed on the substrate receiving part, and the substrate is processed by supplying a process gas into the process chamber. At least a water vapor is supplied into the process chamber when the substrate is placed on the substrate receiving part. After that, the substrate on the substrate receiving part is carried out of the process chamber.

According to another embodiment of the present invention, there is provided a substrate processing apparatus that includes a process chamber, a rotatable turntable having a substrate receiving part provided in the process chamber, and a transfer arm configured to transfer a substrate. The substrate processing apparatus further includes a first process gas supply unit configured to supply a first process gas to a surface of the turntable, and a second process gas supply unit configured to supply a second process gas to the surface of the turntable. The second process gas supply unit is provided apart from the first process gas supply unit in a rotational direction of the turntable. Separation gas supply units are provided between the first process gas supply unit and the second process gas supply unit and between the second process gas supply unit and the first process gas supply unit along the rotational direction of the turntable and configured to supply a separation gas for separating the first process gas and the second process gas. The substrate processing apparatus further includes an oxygen gas supply unit configured to supply oxygen gas to the surface of the turntable, a hydrogen gas supply unit configured to supply hydrogen gas to the surface of the turntable, and a control unit. The control unit is configured to control operations of at least the turntable, the transfer arm, the first process gas supply unit, the second process gas supply unit, the oxygen gas supply unit and the hydrogen gas supply unit. The control unit is configured to further control placing the substrate on the substrate receiving part by using the transfer arm, processing the substrate placed on the substrate receiving part by supplying the first process gas and the second process gas from the first process gas supply unit and the second process gas supply unit, respectively, supplying oxygen gas and hydrogen gas from the oxygen gas supply unit and the hydrogen gas supply unit, respectively, so as to supply at least a water vapor to the surface of the turntable, and carrying the substrate out of the process chamber by using the transfer arm.

According to another embodiment of the present invention, there is provided a substrate processing apparatus that includes a process chamber, a rotatable turntable having a substrate receiving part provided in the process chamber, and a transfer arm configured to transfer a substrate. The substrate processing apparatus further includes a first process gas supply unit configured to supply a first process gas to a surface of the turntable, and a second process gas supply unit configured to supply a second process gas to the surface of the turntable. The second process gas supply unit is provided apart from the first process gas supply unit in a rotational direction of the turntable. Separation gas supply units are provided between the first process gas supply unit and the second process gas supply unit and between the second process gas supply unit and the first process gas supply unit along the rotational direction of the turntable and configured to supply a separation gas for separating the first process gas and the second process gas. The substrate processing apparatus further includes a water storage unit to store water and configured to be able to heat the water therein, an introduction including a flow control vale provided therein connecting the water storage tank with process chamber, and a control unit. The control unit is configured to control operations of at least the turntable, the transfer arm, the first process gas supply unit, the second process gas supply unit, the heating of the water storage tank and the flow control valve. The control unit is configured to further control placing the substrate on the substrate receiving part by using the transfer arm, processing the substrate placed on the substrate receiving part by supplying the first process gas and the second process gas from the first process gas supply unit and the second process gas supply unit, respectively, supplying at least a water vapor into the process chamber by heating the water stored in the water storage tank and controlling the flow control valve, and carrying the substrate out of the process chamber by using the transfer arm.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

A description is given below of a substrate processing apparatus preferable for performing a method for processing a substrate according to embodiments of the present invention, with reference to accompanying drawings.

As discussed above, when an oxide-based film such as a silicon oxide film or the like is deposited on a wafer, particles are more likely to be generated than when a nitride-based film such as a silicon-nitride film or the like is deposited on the wafer. Hence, in the embodiment, although a description is given below of a configuration example of a substrate processing apparatus that includes a rotatable turntable on which a plurality of wafers is placed in a vacuum chamber and can deposit an oxide-based film such as silicon oxide film on the wafers placed on the turntable and a method for depositing a film using the substrate processing apparatus, the embodiment of the present invention is not limited thereto in this regard.

[Configuration of Substrate Processing Apparatus]

Figure 1:
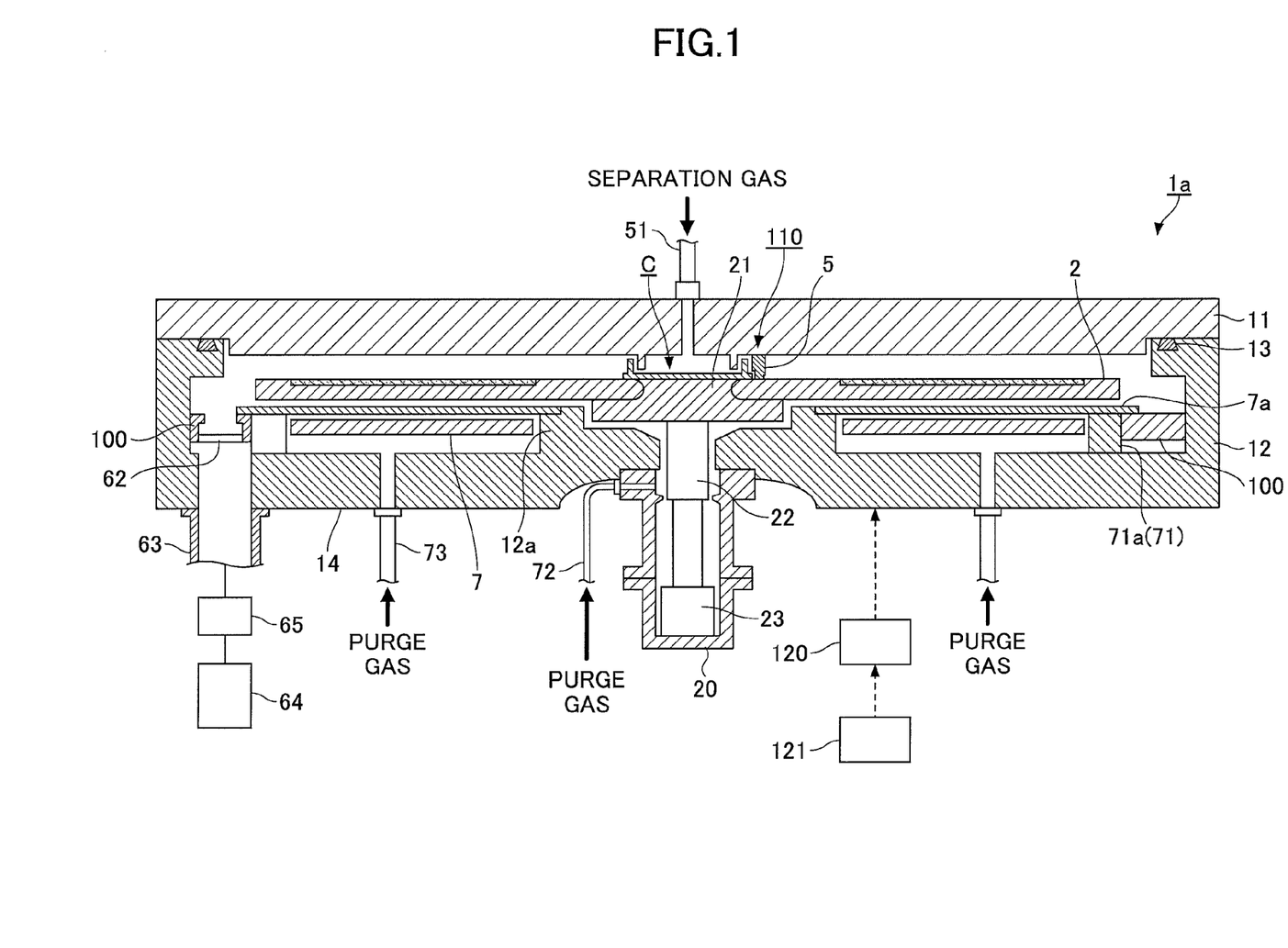
FIG. 1 is a schematic vertical cross-sectional view illustrating an example of a substrate processing apparatus according to an embodiment of the present invention.
Figure 2:
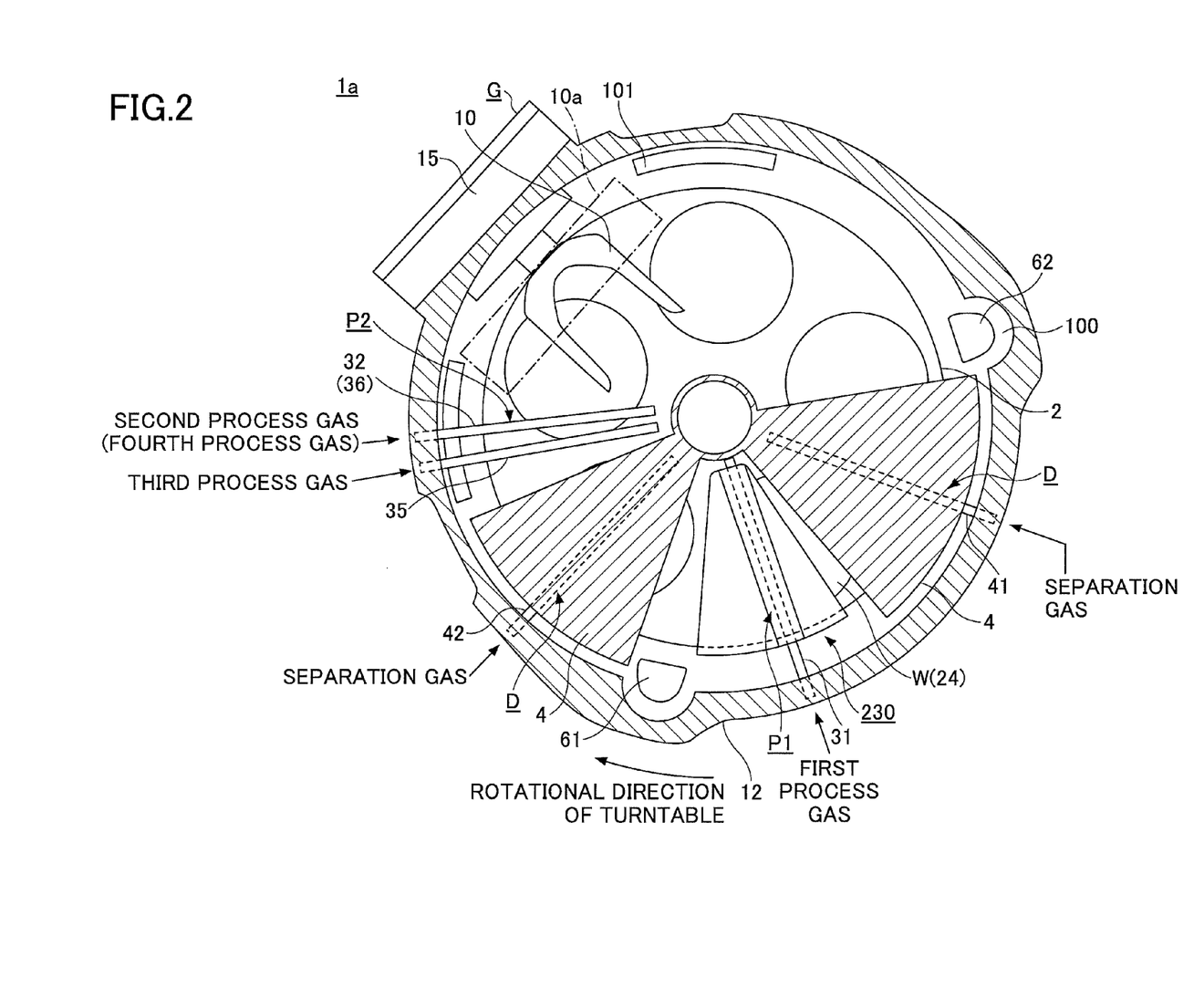
FIG. 2 is a schematic plan view illustrating an example of a substrate processing apparatus according to an embodiment of the present invention.

FIG. 1 is a schematic vertical cross-sectional view illustrating an example of a substrate processing apparatus according to an embodiment of the present invention. FIG. 2 is a schematic plan view illustrating an example of the substrate processing apparatus of the embodiment. Here, in FIG. 2, for convenience of explanation, depiction of a ceiling plate 11 is omitted.

As illustrated in FIG. 1, the substrate processing apparatus according to the embodiment includes a vacuum chamber 1 (which is hereinafter called a chamber 1) having an approximately round planar shape, and a turntable 2 provided in the chamber 1 having a center of rotation that coincides with the center of the chamber 1.

The chamber 1 includes a ceiling plate 11 (ceiling part) provided in a position facing concave portions 24 of the turntable 2 and a chamber body 12. The concave portions 24 are described later. A ring-shaped seal member 13 is provided in a periphery of an upper surface of the chamber body 12. The ceiling plate 11 is configured to be attachable and detachable to and from the chamber body 12. A diameter dimension (inner diameter dimension) of the process chamber 1 when seen in a plan view is not limited, but, for example, can be made about 1100 mm.

A separation gas supply pipe 51 that supplies a separation gas is connected to a central part of the ceiling plate 11 and on an upper side of the process chamber 1 to prevent different process gases from mixing with each other in a central area C within the process chamber 1.

The turntable 2 is fixed to a core portion 21 having a cylindrical shape at the central portion. The turntable 2 is configured to be rotatable by a drive unit 23 around a vertical axis relative to a rotational shaft 22 that is connected to a lower surface of the core portion 21 and extending in a vertical direction, in a clockwise fashion in the example illustrated in FIG. 2. A diameter dimension of the turntable 2 can be made, for example, about 1000 mm, although being not limited thereto.

The rotational shaft 22 and the motor 23 are housed in a case body 20. This case body 20 includes a flange part on its upper surface side, which is hermetically attached to a lower surface of a bottom part 14 of the process chamber 1. A purge gas supply pipe 72 to supply $N_2$ gas or the like as a purge gas (separation gas) to an area below the turntable 2 is connected to the case body 20.

A portion on peripheral side of the core portion 21 in the bottom part 14 of the process chamber 1 is formed into a ring-like shape and constitutes a protrusion part 12a so as to come close to the back surface of the turntable 2, approaching from the lower side.

Circular concave portions 24 are formed in a surface of the turntable 2 as a substrate receiving area to receive wafers W having a diameter dimension of, for example, 300 mm. The concave portions 24 are provided at a plurality of locations, for example, five locations along a rotational direction of the turntable 2. Each of the concave portions 24 has an inner diameter that is slightly greater than a diameter of the wafer W, for example, by about 1 to 4 mm. Moreover, each of the concave portions 24 is configured to have a depth approximately equal to or greater than the thickness of the wafer. Accordingly, when the wafer W is placed in the concave portion 24, the surface of the wafer W and the surface of the turntable 2 (which means an area where the wafer is not placed) have approximately the same height, or the surface of the wafer W is lower than the surface of the turntable 2. Even when the concave portion 24 is configured to be deeper than the thickness of the wafer W, the depth is preferably configured to be equal to or less than about three times as deep as the thickness of the wafer W because forming the concave portion 24 to be too deep could affect the film deposition. Moreover, through-holes not illustrated in the drawing are formed in bottom surfaces of the concave portions 24 to allow, for example, three lifting pins to penetrate therethrough in order to elevate and lower the wafer W by pushing up the wafer W from beneath.

As illustrated in FIG. 2, a plurality of gas nozzles for example, made of quartz, are arranged at locations facing passing areas of the concave portions 24 in the turntable 2. In the example illustrated in FIG. 2, the plurality of gas nozzles is configured to include four gas nozzles 31, 32, 41, 42 to deposit a silicon oxide film and two gas nozzles 35, 36 to reduce the generation of the particles within the chamber. In the example illustrated in FIG. 2, the nozzle 32 is configured to serve as the nozzle 36, and the reason for this is described later.

Each of the nozzles 31, 32, 35, 36, 41 and 42 are arranged between the turntable 2 and the ceiling plate 11. Moreover, each of the nozzles 31, 32, 35, 36, 41 and 42 is installed in the process chamber 1 so as to horizontally extend from an outer peripheral wall of the process chamber 1 toward the central area C and to face the wafers W. Here, each of the gas nozzles 31, 32, 35, 36, 41 and 42 is connected to each gas source not illustrated in the drawing through a flow regulating valve.

With respect to the nozzles 31, 32, 41 and 42 for film deposition, in the example illustrated in FIG. 2, the separation gas nozzle 41, the first process gas nozzle 31, the separation gas nozzle 42, and the second process gas nozzle 32 are arranged in this order in a clockwise fashion (rotational direction of the turntable 2) from a transfer opening 15 described later.

Furthermore, the third process gas nozzle 35 and fourth process gas nozzle 36 for particle suppression are arranged in the vicinity of the second process gas nozzle 32. In the example illustrated in FIG. 2, the second process gas nozzle 32 is configured to also serve as the fourth process gas nozzle 36, and the third process gas nozzle 35 is arranged on the upstream side in the rotational direction of the turntable 2 relative to the second process gas nozzle 32.

The first process gas nozzle 31 forms a first process gas supply part. For example, when depositing a silicon oxide film on the wafers W, a silicon-containing gas such as 3DMAS [tris(dimethylamino)silane] gas, DIPAS [(diisopropylamino)silane] gas, BTBAS [bis(tertiary-butyl-amino)silane] gas, DCS [dichlorosilane], HCD [hexachlorodisilane] or the like can be used as the first process gas.

The second process gas nozzle 32 forms a second process gas supply part. The second process gas nozzle 32 is usually arranged on the upstream side in the rotational direction of the turntable 2 within a second process area P2. For example, when depositing a silicon oxide film on the wafers W, an oxygen-containing gas such as oxygen ($O_2$) gas, ozone ($O_3$) gas or the like can be used as the second process gas. Here, as described later, the nozzle 36 for particle suppression is, for example, a nozzle that supplies an ozone gas, for example. Because of this, the second process gas nozzle 32 is configured to also serve as the fourth process gas nozzle 36 for particle suppression (see FIG. 2).

The separation gas nozzle 41 and 42 form as separation gas supply parts to prevent the first process gas and the second process gas from mixing with each other. An inactive gas such as $N_2$ gas, a noble gas or the like can be used as the separation gas.

The third process gas nozzle 35 and the fourth process gas nozzle 36 form the third and fourth process gas supply parts, respectively. Hydrogen ($H_2$) gas can be used as the third process gas, and oxygen ($O_2$) gas and ozone ($O_3$) gas can be used as the fourth process gas. Here, in a substrate processing method in the embodiment described later, water vapor is introduced into the process chamber 1 by reacting the third process gas and the fourth process gas with each other. The third process gas nozzle 35 and the fourth process gas nozzle 36 are preferred to be closely arranged to each other. As discussed above, in the example illustrated in FIG. 2, the fourth process gas nozzle 36 is configured to serve as the second process gas nozzle 32. For this reason, the third process gas nozzle 35 is also arranged on the upstream side in the rotational direction of the turntable 2 within the second process area P2.

Figure 3:
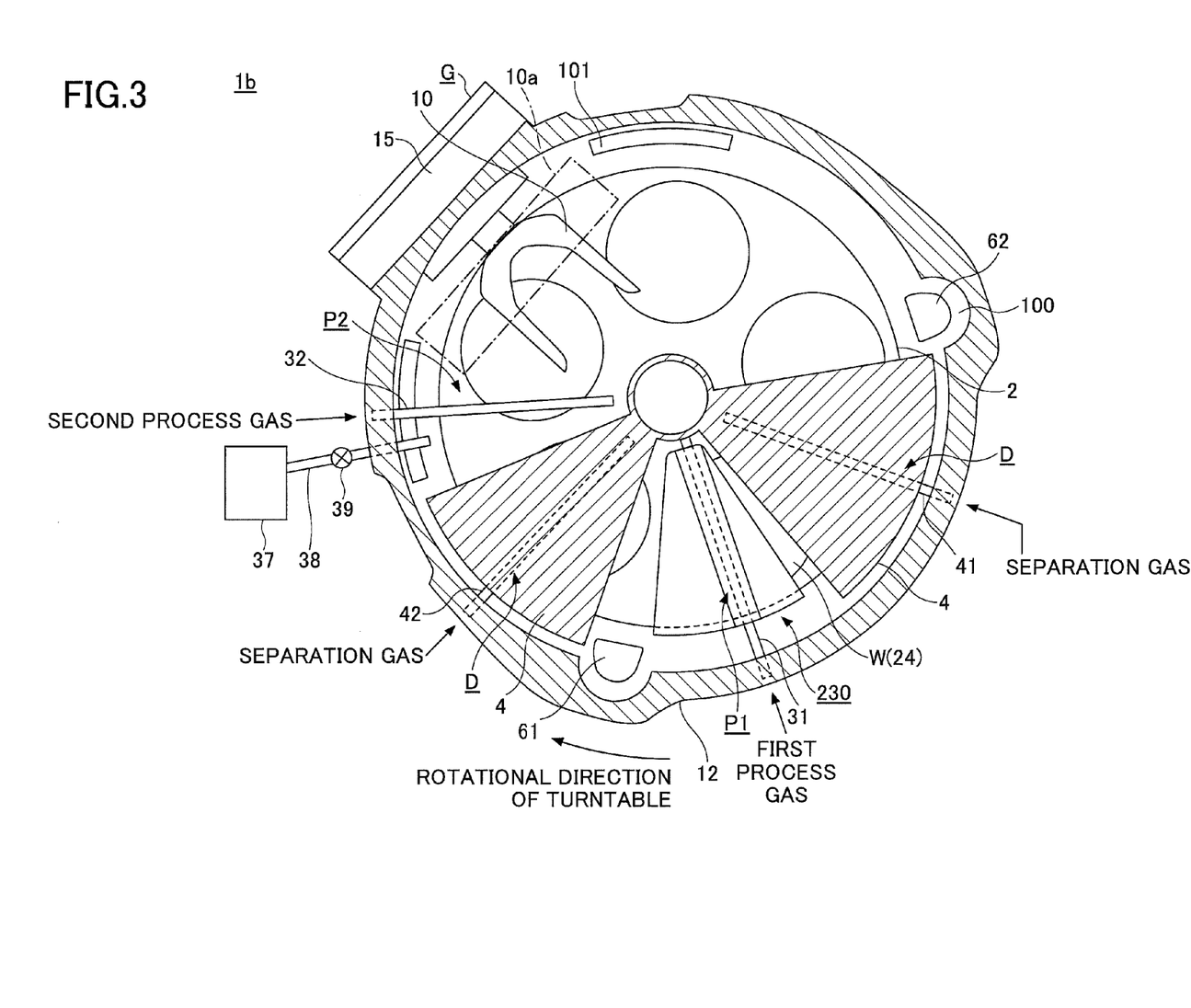
FIG. 3 is a schematic plan view illustrating another example of a substrate processing apparatus according to an embodiment of the present invention.

A description is given below of a modification of the embodiment of introducing water vapor into the process chamber 1 by using the third process gas nozzle 35 and the fourth process gas nozzle 36 illustrated in FIG. 2, with reference to FIG. 3. FIG. 3 illustrates a schematic plan view of another example of the substrate processing apparatus according to an embodiment.

The substrate processing apparatus illustrated in FIG. 3 differs from the substrate processing apparatus illustrated in FIG. 2 in that the third process gas nozzle 35 and the fourth process gas nozzle 36 are not provided but a water storage tank 37, an introduction pipe 38 and a flow regulating valve 39 are provided, instead.

The water storage tank 37 is a tank to store water as a source of water vapor to be introduced into the process chamber 1. Water stored in the water storage tank 37 is evaporated and the water vapor is introduced into the process chamber through the introduction pipe 38. Furthermore, the introduction pipe 38 is a pipe connecting the water storage tank 37 with the process chamber 1, and has a discharge hole not drawn in the drawing formed therein. In addition, the flow regulating valve 39 is provided in the introduction pipe 38.

The substrate processing apparatus illustrated in FIG. 3 can introduce water vapor into the process chamber 1 as well as the substrate processing apparatus illustrated in FIG. 2.

Figure 4:
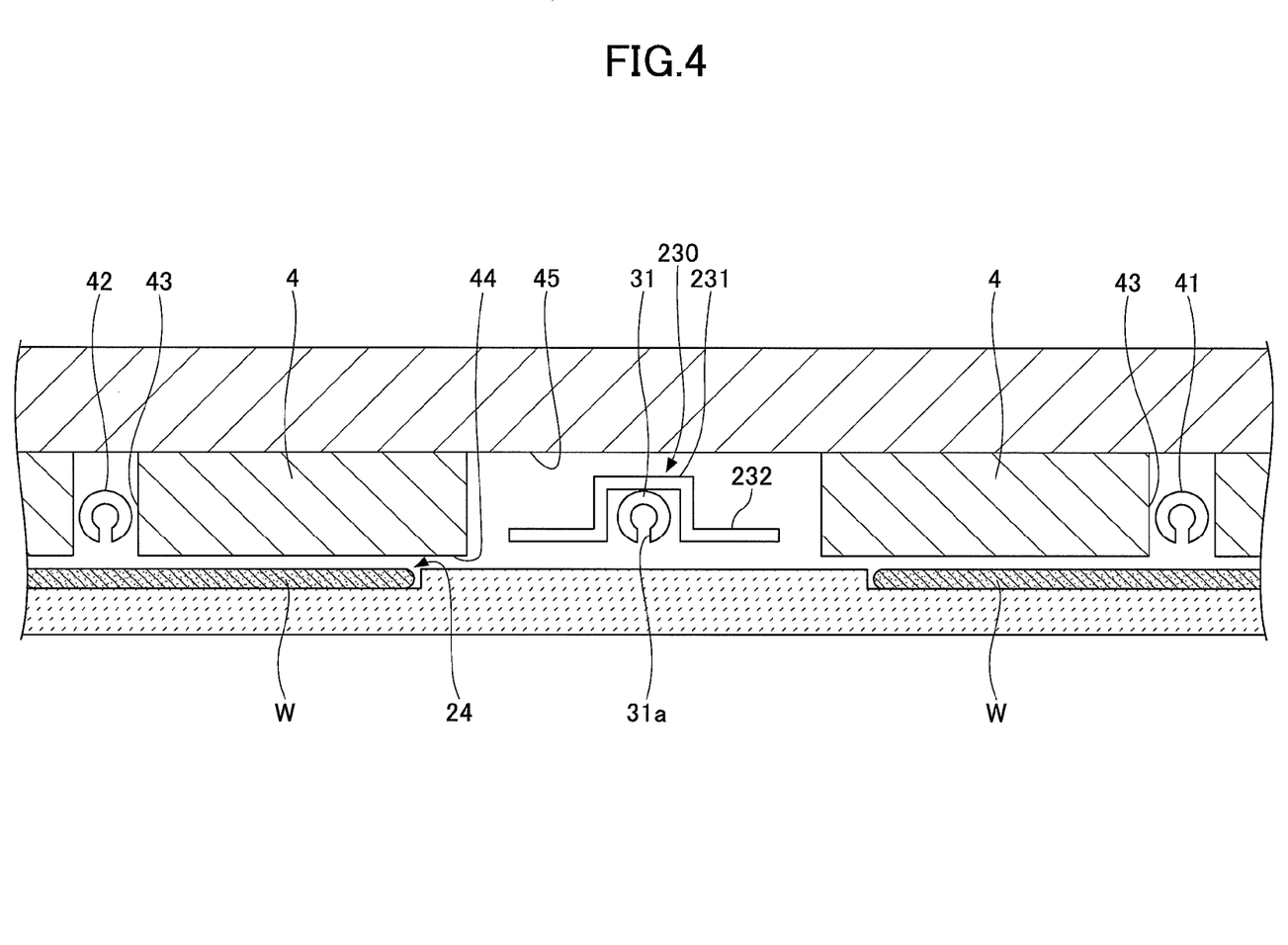
FIG. 4 is a cross-sectional view of a substrate processing apparatus along a concentric circle of a turntable according to an embodiment of the present invention.

As illustrated in FIG. 4, each of the nozzles 31, 32, 35, 36, 41 and 42 includes a plurality of gas discharge holes 31a in its lower surface (a surface facing the turntable 2) to discharge each of the above-discussed gases that are arranged along a radial direction of the turntable 2, for example, at regular intervals. Each of the nozzles 31, 32, 35, 36, 41 and 42 are arranged to have a distance between its lower end and the upper surface of the turntable 2 of, for example, about 1 to 5 mm.

An area under the first process gas nozzle 31 is a first process area P1 to let the first process gas adsorb the first process gas on the wafers W. An area under the second process gas nozzle 32 is the second process area P2 to supply the oxidation gas to the wafers W on which the first process gas has adsorbed and to deposit a silicon oxide film on the wafers W. The separation gas nozzles 41 and 42 are to form separation areas D for separating the first process area P1 and the second process area P2 from each other.

FIG. 4 illustrates a cross-sectional view of the substrate processing apparatus according to the embodiment cut along a concentric circle of the turntable 2. Here, FIG. 4 is a cross-sectional view along the rotational direction of the turntable 2 from one of the separation areas D to the other separation area D through the first process area P1.

Approximately sectorial convex portions 4 are provided on the ceiling plate 11 of the process chamber 1 in the separation areas D. The convex portions 4 are attached to a back surface of the ceiling plate 11, thereby forming flat and low ceiling surfaces 44 (i.e., first ceiling surfaces) that are bottom surfaces of the convex portions 4, and ceiling surfaces 45 (i.e., second ceiling surfaces) that are located on both sides of the ceiling surfaces 44 in the circumferential direction and higher than the ceiling surfaces 44.

As illustrated in FIGS. 2 and 4, the convex portions 4 forming the ceiling surface 44 have an approximately sectorial planar shape whose apex is cut in an arc-like form. In addition, a groove 43 is formed in the convex portion 4 so as to extend along the radial direction of the turntable 2 at the center in the circumferential direction. The groove portion 43 houses the separation gas nozzles 41 and 42. Here, each of the peripheral portions of the convex portions 4 (outer edge portion of the process chamber 1) faces an outer edge surface of the turntable 2 and is bent into an L shape in a manner slightly apart from the chamber body 12 in order to prevent the process gases from mixing with each other.

A nozzle cover 230 is provided on an upper side of the first process gas nozzle 31 in order to cause the first process gas to circulate along the wafers W and to cause the separation gas to circulate on the ceiling plate 11 side and to flow away from the neighborhood of the wafers W. As illustrated in FIG. 4, the nozzle cover 230 includes a cover body 231 having a box-like shape whose lower surface is opened to accommodate the first process gas nozzle 31, and current plates 232 having a plate-like shape that are connected to opening lower ends of the cover body 231 on the upstream side and on the downstream side in the rotational direction of the turntable 2, respectively. Here, a side wall surface of the cover body 231 on the rotational center side of the turntable 2 extends toward the turntable 2 (downward) so as to face the tip of the first process gas nozzle 31. Also, a side wall surface of the cover body 231 on the outer peripheral side of the turntable 2 is cut off so as not to interfere with the first process gas nozzle 31.

As illustrated in FIG. 2, a side ring that forms a cover body is arranged on the outer circumferential side of the turntable 2 and in a position slightly lower than the turntable 2. Exhaust openings 61 and 62 are formed at, for example, two locations so as to be apart from each other in the circumferential direction in the upper surface of the side ring 100. In other words, two exhaust ports are formed in the bottom surface of the process chamber 1, and the exhaust openings 61 and 62 are formed at locations corresponding to these exhaust ports in the side ring 100.

In the present specification, one and the other of the exhaust openings 61 and 62 are called a first exhaust opening 61 and a second exhaust opening 62, respectively. Here, the first exhaust opening 61 is formed at a location closer to the separation area D than to the first process gas nozzle 31 between the first process gas nozzle 31 and the separation area D located on the downstream side in the rotational direction of the turntable 2 relative to the first process gas nozzle 31. Also, the second exhaust opening 62 is formed at a location closer to the separation area D than to the second process gas nozzle 32 between the second process gas nozzle 32 and the separation area D located on the downstream side in the rotational direction of the turntable 2 relative to the second process gas nozzle 32.

The first exhaust opening 61 is to evacuate the first process gas and the separation gas, and the second exhaust opening 62 is to evacuate the second process gas and the separation gas.

Each of the first exhaust opening 61 and the second exhaust opening 62 is connected to, for example, a vacuum pump 64 of an evacuation mechanism through an evacuation pipe 63 including a pressure control unit 65 such as a butterfly valve or the like.

As illustrated in FIG. 1, a protrusion portion 5 is provided on the lower surface of the ceiling plate 11 so as to be formed into an approximately ring-like shape in the circumferential direction continuously from a region on the rotational center C side in the convex portion 4, and has a lower surface formed as high as the lower surface of the convex portion 4 (ceiling surface 44). A labyrinth structure part 110 may be arranged in a region on the rotational center side of the turntable 2 inside the protrusion portion 5 and on the upper side of the core portion 21 in order to prevent various gases mixing with each other in the central area C. Forming the labyrinth structure part 110 on the upper side of the core portion 21 can extend a flow passage of the gases and can prevent the gases from mixing with each other More specifically, the labyrinth structure part 110 has a structure including a wall part vertically extending from the turntable 2 toward the ceiling plate 11 and a wall part extending from the ceiling plate 11 toward the turntable 2 that are formed in the circumferential direction, respectively, and arranged alternately in the radial direction of the turntable 2. In the labyrinth structure part 110, for example, the first process gas discharged from the first process gas nozzle 31 and going toward the central area C needs to get over the labyrinth structure part 110. Because of this, the flow speed of the gases decreases with decreasing the distance from the central area C, and the gases are unlikely to diffuse. As a result, before the process gases reach the central area C, the separation gas supplied to the central area C pushes the process gases back toward the process area P1. Moreover, the other gases going toward the central area C is unlikely to reach the central area C by the labyrinth structure part 110, similarly. This prevents the process gases from mixing with each other in the central area C.

On the other hand, nitrogen gas supplied to the central area C from the separation gas supply pipe 51 is likely to vigorously diffuse in the circumferential direction, but because the labyrinth structure part 110 is provided, the flow speed of nitrogen gas is reduced as nitrogen gas gets over the labyrinth structure part 110. In this case, nitrogen gas is likely to intrude into a very small area, for example, between the turntable 2 and a protrusion part 92, but because the labyrinth structure part 110 suppress the flow speed, nitrogen gas flows toward a relatively broad area such as an area for moving forward and backward of the transfer arm 10.

As illustrated in FIG. 1, a heater unit 7 that is a heating mechanism is provided in a space between the turntable 2 and the bottom part 14 of the chamber 1. The heater unit 7 is configured to be able to heat the wafers W on the turntable 2, for example, from room temperature to about 760 degrees C. through the turntable 2. Here, as illustrated in FIG. 1, an outer cover member 71a is provided on a lateral side of the heater unit 7 and an upper cover member 7a that covers an upper side of the heater unit 7 is further provided. Furthermore, a plurality of purge gas supply pipes 73 for purging a space in which the heater unit 7 is arranged is provided at a plurality of locations along the circumferential direction under the heater unit 7.

As illustrated in FIG. 2, a transfer opening 15 is formed in the side wall of the chamber 1 to transfer the wafer W between a transfer arm 10 and the turntable 2. The transfer opening 15 is configured to be hermetically openable and closeable by a gate valve G. Moreover, a camera unit 10a is provided above the ceiling plate 11 and in an area where the transfer arm 10 moves forward and backward relative to the process chamber 1 to detect an edge of the wafer W. This camera unit 10a is used to detect, for example, whether or not the wafer W is present on the transfer arm 10, or a position aberration of the wafer W placed on the turntable 2 by taking an image of the edge of the wafer W. The camera unit 10a is configured to have a wide field of view to the degree corresponding to a diameter dimension of the wafer W.

Each of the wafers W is transferred between the concave portions 24 of the turntable 2 and the transfer arm 10 at a position where one of the concave portions 24 faces the transfer opening 15. Hence, not illustrated lifting pins and a lifting mechanism for lifting the wafer W from the back surface thereof by penetrating through the concave portion 24 are provided under the turntable 2 and in locations corresponding to the wafer transferring position.

Furthermore, a control unit 120 for controlling an operation of the entire apparatus and constituted of a computer is provided in the substrate processing apparatus according to the embodiment of the present invention. A memory in the control unit 120 stores a program for performing a substrate process described later.

This program includes a group of steps organized to cause the substrate processing apparatus to implement a variety of operations, and is installed into the control unit 120 from a memory unit 121 constituted of a storage medium such as a hard disk, a compact disc, a magnetic optical disk, a memory card and a flexible disk and the like.

[Method for Processing a Substrate]

Next, a description is given below with reference to FIG. 5 of a method for processing a substrate using the substrate processing apparatus of the embodiment that can reduce the generation of particles even when a cumulative film thickness of a cumulative film becomes great.

Figure 5:
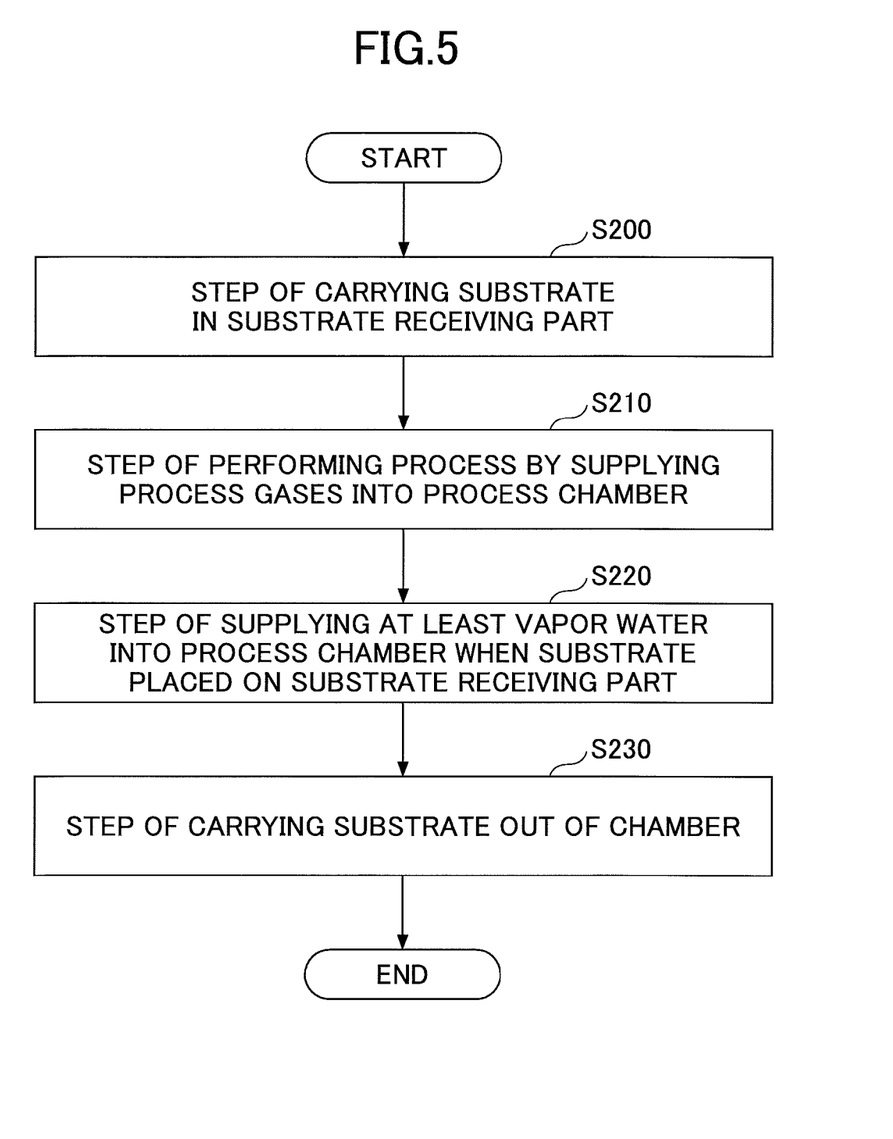
FIG. 5 is a flowchart illustrating an example of a method for processing a substrate according to an embodiment of the present invention.

FIG. 5 illustrates a flowchart of an example of the method for processing a substrate according to an embodiment.

The method for processing the substrate according to the embodiment is a method for processing a substrate using a substrate processing apparatus including a process chamber and a rotatable turntable having a substrate receiving part provided in the process chamber, the method including steps of:

carrying a substrate in the substrate receiving part (S200);
performing a process on the carried substrate by supplying a process gas into the process chamber (S210);
supplying at least a water vapor in a state of the substrate being placed on the substrate receiving part (S220); and
carrying the substrate out of the process chamber (S230).

A specific description is given below of each of the steps according to the embodiment.

(Carry-In Step S200)

To begin with, when transferring a substrate such as a wafer or the like, the gate valve G of the transfer opening 15 is opened. Then, the transfer arm 10 places each wafer W on supporting pins (not illustrated in the drawing) and elevated from the turntable 2 and to a position above the turntable 2 while intermittently rotating the turntable 2. After that, the wafer W is placed on the turntable by lowering the supporting pins.

(Processing Step S210)

Next, the gate valve G is closed, and the wafers W are heated up to a predetermined temperature by the heater unit 7 while rotating the turntable 2. Subsequently, while supplying a first process gas (e.g., 3DMAS gas) from a first process gas nozzle 31 at a predetermined flow rate, a second process gas (e.g., ozone gas or oxygen gas) is further supplied from the second process gas nozzle 32. Then, the inside of the process chamber 1 is adjusted to a predetermined pressure by the vacuum pump 64 and the pressure control unit 65.

The first process gas adsorbs on a surface of the wafers W in the first process area P1 by the rotation of the turntable 2. Next, the first process gas adsorbing on the wafers W is oxidized by the second process gas in the second process area P2. By doing this, one or a plurality of molecular layers of an oxide film that constitute a component of a thin film are deposited, and a reaction product is formed.

Here, the separation areas D are arranged between the process areas P1 and P2 and both sides of the process areas P1 and P2 in the circumferential direction in the substrate processing apparatus according to the embodiment. Due to this, while the first process gas and the second process gas are prevented from mixing with each other in the separation areas D, each of the first process gas and the second process gas is evacuated from each of the exhaust openings 61 and 62.

(Water Vapor Supplying Step S220)

Subsequently, the supply of the first process gas and the second process gas stops. Here, in the water vapor supplying step S220 of the embodiment, a temperature of the wafers W, a pressure inside the process chamber 1 and a rotational speed of the turntable 2 can be set at approximately the same values in the processing step S210. However, the above parameters may be changed from the values of the processing step S210.

Then, the third process gas nozzle 35 supplies a third process gas (hydrogen gas) and the fourth process gas nozzle 36 supplies a fourth process gas (oxygen gas).

This causes the supplied hydrogen gas and oxygen gas to react with each other, and a water vapor is introduced into the process chamber 1. This makes it possible to relieve stress of the cumulative film (deposited film) deposited on the inner wall of the process chamber 1 by the processing step S210. Because of this, even when the film thickness of the cumulative film becomes great, the generation of the particles caused by the cracks, flakes and the like of the cumulative film can be reduced.

Although a flow rate of hydrogen gas in the water vapor supplying step S220 is not limited, for example, the flow rate can be set in a range from 0.5 slm to 4.0 slm. In addition, although a flow rate of oxygen gas is not limited, for example, the flow rate can be set in a range from 0.5 slm to 4.0 slm.

Although the temperature of the wafers W in the water vapor supplying step S220 is not limited, for example, the temperature can be set in a range from 450 degrees C. to 760 degrees C.

Moreover, although the pressure inside the process chamber 1 in the water vapor supplying step S220 is not limited, for example, the pressure can be set at 6.7 Torr (893 Pa).

Furthermore, although the rotational speed of the turntable 2 in the water vapor supplying step S220 is not limited, for example, the rotational speed can be set in a range from 30 rpm to 240 rpm.

In addition, although a period for supplying hydrogen gas and oxygen gas in the water vapor supplying step S220 is not limited, for example, the period can be set in a range from 2 seconds to 30 seconds, preferably in a range from 5 seconds to 10 seconds. When a period for supplying the water vapor is shorter than 2 seconds, an effect of reducing the stress of the cumulative film may decrease. On the other hand, when the period for supplying the water vapor exceeds 30 seconds, the film quality of the thin film deposited on the wafers W may be affected, and the productivity is deteriorated.

Here, water stored in the water storage tank 37 may be evaporated by heating water and a water vapor may be introduced into the process chamber 1 as a modification of the water vapor supplying step S220, as discussed above. In this case, water stored in the water storage tank 37 is heated by a heating device not illustrated in the drawings to be evaporated, and the water vapor is introduced into the process chamber through a discharge opening formed in the introduction pipe 38 at a predetermined flow rate by the flow regulating valve 39.

(Substrate Carry-Out Step S230)

When carrying the wafers W out of the process chamber 1, to begin with, the supply of hydrogen gas and oxygen gas stops. Next, the process chamber 1 is evacuated to eject hydrogen gas (and oxygen gas) from the inside of the process chamber 1, and the gate valve G is opened. Then, the wafer W placed on the turntable 2 is elevated by the supporting pins not illustrated in the drawings, and the next wafer W to be processed is placed on the supporting pins, upon carrying the wafer W on the supporting pins out of the process chamber 1.

The method for processing the substrate including the water vapor supplying step S220 of the embodiment can reduce the stress of the cumulative film, and the generation of the particles caused by the cracks, flakes or the like can be suppressed. Accordingly, a cleaning treatment does not have to be performed until the cumulative film thickness of the cumulative film becomes great (e.g., until the cumulative film thickness exceeds 3 µm), a period of time allocable to the film deposition process can be lengthened.

Moreover, the water vapor supplying step S220 according to the embodiment can be performed within an operation of the substrate process. Due to this, upon carrying the wafers W on which the film deposition process has been performed out of the process chamber 1, the next wafers W can be carried into the process chamber (see step S200). As a result, a period for one transfer process can be shortened compared to the case of performing the similar process between the operations of the substrate process.

As a result, the method for processing the substrate according to the embodiment has a long PM (Production Maintenance) cycle of the substrate processing apparatus and a short downtime of the substrate processing apparatus.

Next, a more detailed description is given below of embodiments of the present invention by citing specific working examples.

(First Working Example)

A description is given below of a working example in which an effect of the water vapor supplying step (S220) was particularly confirmed in the method for processing the substrate according to the embodiment.

To begin with, silicon wafers W were carried in a substrate processing apparatus, on an inner wall of which a cumulative film having a predetermined cumulative film thickness was deposited, and a film deposition process of depositing a silicon oxide film was performed under predetermined conditions as a comparative example. Next, upon carrying the silicon wafers W subject to the film deposition process out of the film deposition apparatus, the next set of silicon wafers W were carried into the substrate processing apparatus and the film deposition process of depositing the silicon oxide film was performed under the similar conditions.

As discussed above, a series of carrying the silicon wafers W into the substrate processing apparatus, depositing the film on the silicon wafers W and carrying the silicon wafers W out of the substrate processing apparatus was made one cycle (one operation), and the operation was repeated 93 times (total 94 operations). Then, the cumulative film thickness of the cumulative film after each operation and a number of generated particles after a predetermined number of times of operations were obtained by measurement.

Next, when carrying the last silicon wafers W for the comparative example out of the substrate processing apparatus, the next silicon wafers W were carried into the substrate processing apparatus. Then, a film deposition process of the silicon oxide film was performed on the wafers W under the same conditions as those in the comparative example, and a step of supplying the water vapor was further performed. After that, upon carrying the silicon wafers W out of the substrate processing apparatus, after the step of supplying water vapor was performed thereon, the next silicon wafers W were carried in, and the film deposition process of the silicon oxide film was performed under the similar process conditions.

As discussed above, the series of carrying the silicon wafers W into the substrate processing apparatus, depositing the film on the silicon wafers W and carrying the silicon wafers W out of the substrate processing apparatus was made one cycle (one operation), and the operation was repeated 67 times (total 68 operations, a number of times of operations added to the comparative example: 162 operations). Then, similar to the comparative example, the cumulative film thickness of the cumulative film after each operation and a number of generated particles after a predetermined number of times of operations were obtained by measurement.

Here, process conditions of the step of supplying the water vapor were made as follows:

Process temperature: 620 degrees C.
Pressure inside the process chamber 1: 6.7 Torr
Rotational speed of the turntable 2: 120 rpm
Gas flow rate $H_2/O_2$: 0.8 slm/1.2 slm
Period for supplying the gas: 10 seconds.

Figure 6:
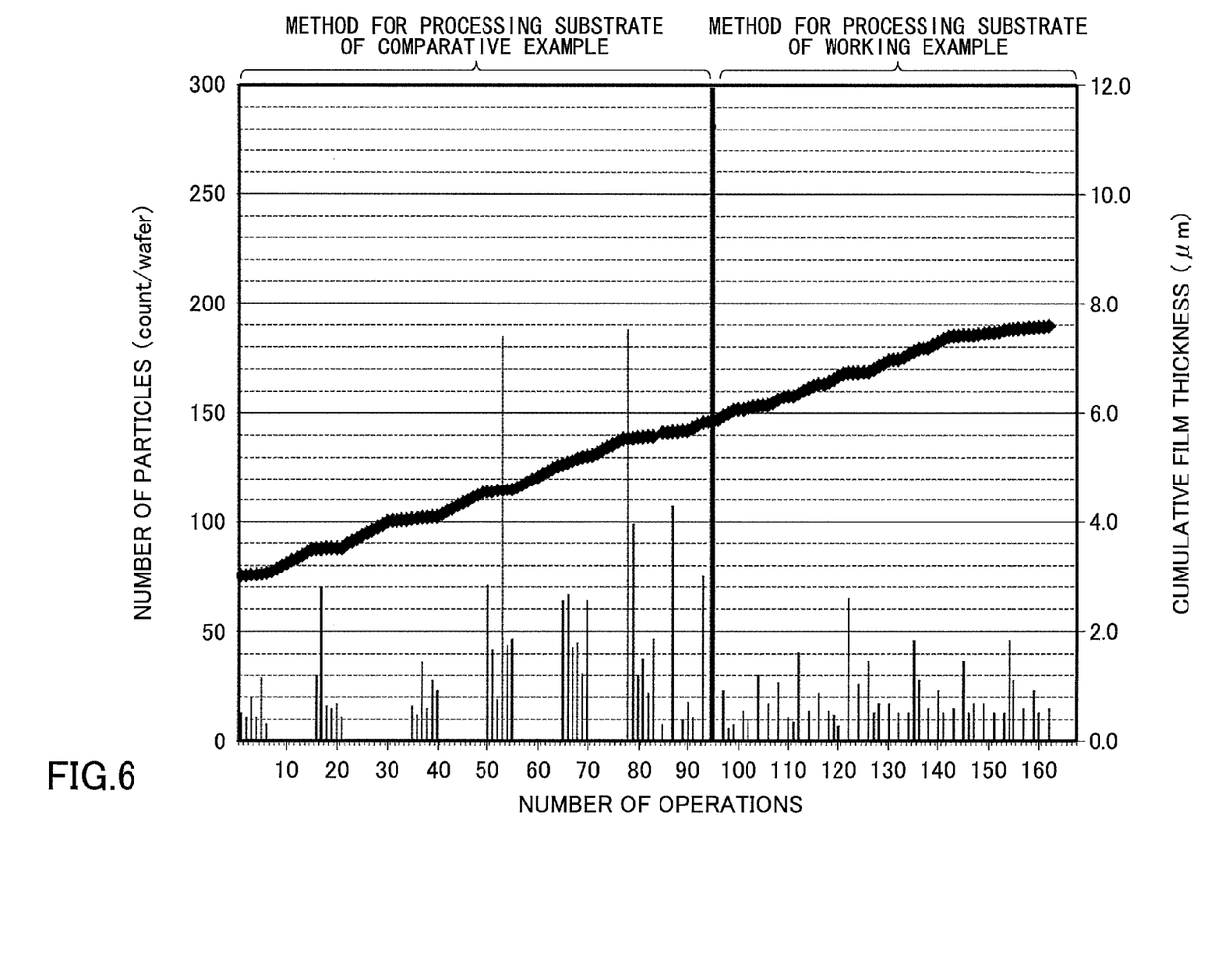
FIG. 6 is a schematic chart for explaining an example of an effect of method for processing a substrate according to an embodiment of the present invention.

FIG. 6 is a schematic chart for explaining an example of an effect of the method for processing the substrate of the working example. The horizontal axis in FIG. 6 indicates a number of operations, and the vertical axis indicates a cumulative film thickness (a line graph) and a number of particles (a bar graph). Here, with respect to the number of particles, the number of particles only after the predetermined operations were measured is shown.

As illustrated in FIG. 6, in the first comparative example, the number of generated particles increased as the number of operations and the cumulative film thickness increased. This was because the particles were likely to be generated caused by the cracks, flakes or the like of the cumulative film as the cumulative film thickness increased.

In contrast, in the method for processing the substrate according to the working example, the number of particles was small even though the cumulative film thickness was greater than that of the comparative example. Even when the cumulative film thickness became great, the number of particles was unlikely to increase. It is thought that the stress of the cumulative film was relieved and the cracks and flakes of the cumulative film were reduced because the step of supplying the water vapor was performed in the method for processing the substrate in the working example.

From a standpoint of the productivity of the semiconductor device, increasing a period of time allocable to the film deposition process is preferred, and more specifically, a substrate processing apparatus is demanded that does not need a cleaning treatment until the film thickness of the cumulative film reaches at least 10 µm. However, the substrate processing apparatus that can implement the method for processing the substrate according to the embodiments of the present invention can prevent the generation of particles even when the film thickness of the cumulative film becomes great.

According to the embodiments of the present invention, a method for processing a substrate can be provided that can reduce the generation of particles.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention.

What is claimed is:

1. A method for processing a substrate using a substrate processing apparatus including a process chamber and a turntable having a substrate receiving part provided in the process chamber, the method comprising steps of:
   placing a substrate on the substrate receiving part;
   processing the substrate by supplying a process gas into the process chamber;
   supplying at least a water vapor into the process chamber, when the substrate is placed on the substrate receiving part, for a period of 2 to 30 seconds; and
   carrying the substrate on the substrate receiving part out of the process chamber.

2. The method as claimed in claim 1, wherein the steps of placing the substrate, processing the substrate and supplying the water vapor are repeated a predetermined number of times.

3. The method as claimed in claim 1, wherein the step of processing the substrate includes a step of depositing a cumulative film on the substrate, and further comprising a step of:
   cleaning an inside of the process chamber after a film thickness of the cumulative film deposited on the inside of the process chamber exceeds 10 micrometers.

4. The method as claimed in claim 3, wherein the step of depositing the cumulative film includes a step of depositing an oxide film on the substrate.

5. The method as claimed in claim 2, wherein the substrate processing apparatus includes a transfer arm configured to transfer the substrate between an inside and an outside of the process chamber, and
   wherein the steps of placing the substrate on the substrate receiving part and carrying the substrate out of the process chamber are performed by using the transfer arm, and
   the step of placing the substrate on the substrate receiving part is performed by causing the transfer arm to transfer a next substrate to the inside of the process chamber when carrying the substrate out of the process chamber.

6. The method as claimed in claim 1, wherein the step of supplying the water vapor is performed by supplying hydrogen gas and oxygen gas into the process chamber maintained at a predetermined temperature.

7. The method as claimed in claim 1, wherein the substrate processing apparatus includes a water storage tank holding water, and
   the step of supplying the water vapor includes a step of evaporating the water held in the water storage tank and a step of supplying the water vapor obtained by the step of evaporating the water into the process chamber.

* * * * *